United States Patent
Nandakumar et al.

(10) Patent No.: US 6,204,073 B1
(45) Date of Patent: Mar. 20, 2001

(54) SHALLOW TRENCH ISOLATION WITH CONDUCTIVE HARD MASK FOR IN-LINE MOAT/TRENCH WIDTH ELECTRICAL MEASUREMENTS

(75) Inventors: Mahalingam Nandakumar, Plano; Seetharaman Sridhar, Irving, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/452,921

(22) Filed: Dec. 2, 1999

Related U.S. Application Data
(60) Provisional application No. 60/111,466, filed on Dec. 9, 1998.

(51) Int. Cl.$^7$ .................................................. H01L 21/66
(52) U.S. Cl. .............................................................. 438/17
(58) Field of Search .............................. 438/248, 14, 259, 438/270, 17, 271, 589; 257/330, 475

(56) References Cited

U.S. PATENT DOCUMENTS
| | | | |
|---|---|---|---|
| 5,365,102 | * 11/1994 | Mehrotra et al. | 257/475 |
| 5,637,898 | * 6/1997 | Baliga | 257/330 |

\* cited by examiner

*Primary Examiner*—Matthew Smith
*Assistant Examiner*—Calvin Lee
(74) *Attorney, Agent, or Firm*—Jacqueline J. Garner; W. James Brady, III; Frederick J. Telecky, Jr.

(57) ABSTRACT

A method for forming STI that allows for in-situ moat/trench width electrical measurement is disclosed herein. A conductive layer (18) is used in the hard mask (20) for trench etch. After the hard mask (20) is formed and the trench (12) is etched, the resistance of the conductive layer (18) is measured over a predefined length. Since the length is known, the average width of the hard mask (20)/moat (11) can be determined. Once the width of the moat (11) is known, the width of the trench (12) can easily be determined by subtracting the width of the moat (12) from the pitch, which is a known factor.

18 Claims, 4 Drawing Sheets

SHALLOW TRENCH ISOLATION WITH CONDUCTIVE HARD MASK FOR IN-LINE MOAT/TRENCH WIDTH ELECTRICAL MEASUREMENTS

This application claims priority under 35 USC 119(e)(1) of provisional application Ser. No. 60/111,466 filed Dec. 9, 1998.

FIELD OF THE INVENTION

The invention is generally related to the field of test structures for semiconductor processing and more specifically to test structures for in-line electrical measurement of moat/trench width during semiconductor processing.

BACKGROUND OF THE INVENTION

Shallow trench isolation (STI) is being widely used for isolation in large-scale integrated circuits (ICs) to isolate the active areas of transistors and other devices from each other. STI is formed prior to transistor formation. Typically, a pad oxide and pad nitride are deposited over the surface. The pad oxide and nitride are then patterned and etched to form a hard mask for the trench etch. A shallow trench is then etched into the semiconductor surface. A trench liner is then formed on the surface of the trench and the trench is filled with a dielectric material, such as silicon dioxide. This is followed by CMP and removal of nitride to create active areas.

As ICs become denser, both the active areas and the trench shrink. This places increasing demands on the lithography used to pattern the hard mask/trench. It also requires tighter control of the trench etch. The STI lithography and etch can be monitored/evaluated using top-view SEM (scanning-electron-microscope)/cross-sectional SEM. Since large amounts of data are required for wafer uniformity, SEM analysis becomes time-consuming. Accordingly, a method for monitoring/developing/evaluating STI lithography and etch that is less time consuming and provides wafer uniformity information is desired.

SUMMARY OF THE INVENTION

A method for forming STI that allows for in-situ moat/trench width electrical measurement is disclosed herein. A conductive layer is used in either the hard mask or as part of the resist layer for trench etch. After the mask is formed, the resistance of the conductive layer is measured over a pre-defined length. Since the length is known, the average width of the mask/moat can be determined. Once the width of the moat is known, the width of the trench can easily be determined by subtracting the width of the moat from the pitch, which is a known factor. The conductive layer is removed either during the resist strip or during etch prior to CMP.

An advantage of the invention is providing a structure for in-line measurement of moat/trench width using electrical resistance.

This and other advantages will be apparent to those of ordinary skill in the art having reference to the specification in conjunction with the drawings.

DETAILED DESCRIPTION OF THE EMBODIMENTS

The embodiments of the invention are test structures for evaluating semiconductor structures and processes during fabrication. They are generally placed in the scribe lines of a wafer. Because the fabricated structures vary across a wafer (for example, polysilicon linewidth is known to vary across a wafer), the test structures are places at various locations of the wafer. The test structures are formed using the same process steps as the IC to as closely match the IC structures (i.e., transistors) as possible. The information gained form the test structures is then used to determine such things as whether the fabrication steps have been performed satisfactorily or predict whether the IC transistors will function within their design specifications.

Figure 1A:
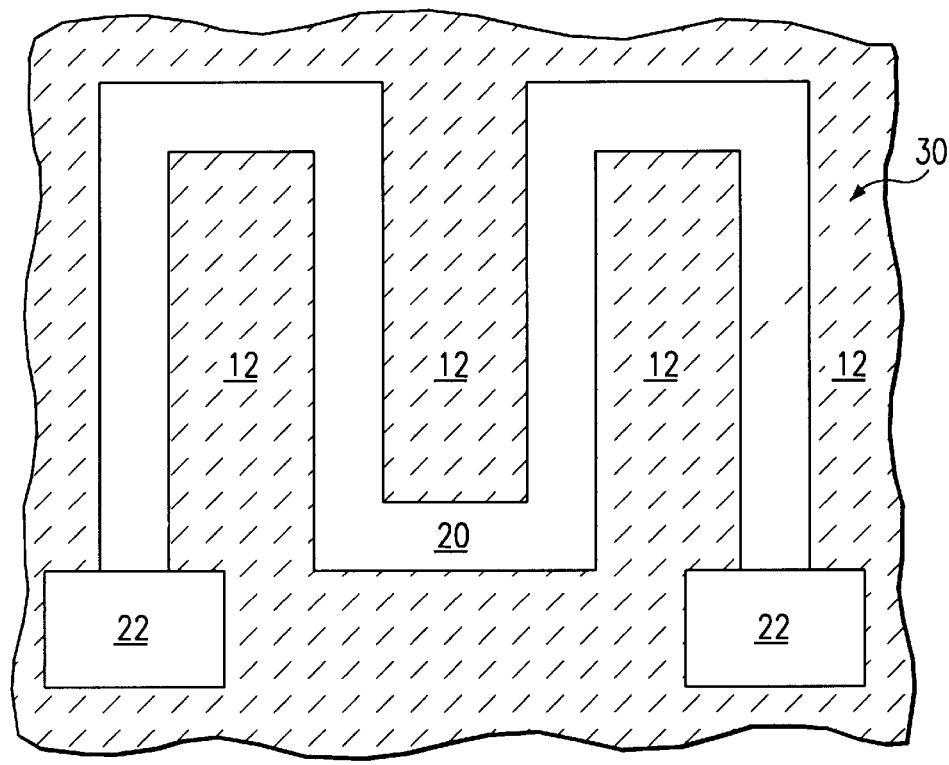
FIGS. 1A & 1B are top-view diagrams of a test structure for trench width according to a first and a second embodiment of the invention, respectively.
Figure 2:
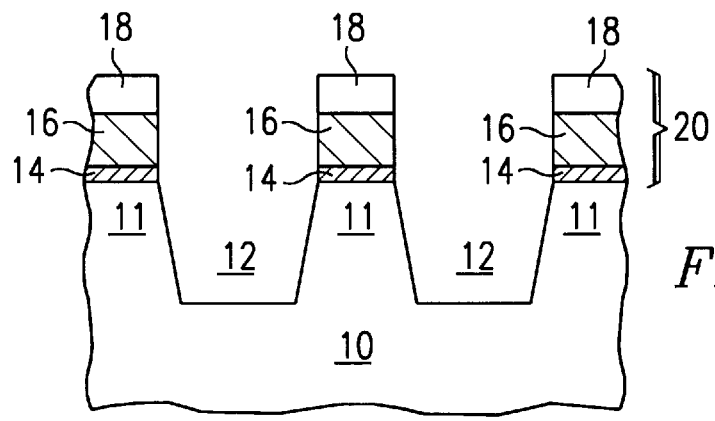
FIG. 2 is a cross-sectional diagram of the test structure of FIG. 1A or 1B.

A first embodiment of the invention is shown in FIGS. 1A & 2. FIG. 1A is a top view and FIG. 2 is a cross-sectional view. The hard mask 20 covers the moat regions 11 of semiconductor 10 and exposes the portion of semiconductor 10 that is etched to form trench 12. Transistors and other devices (not shown) are subsequently formed in the moat or active regions 11. For a test structure 30 (as shown in FIG. 1A), probe pads 22 are located at the ends of a portion of hard mask 20. Hard mask 20 extends back and forth over a portion of semiconductor 10 to create a repeated pitch of moat/trench/moat/trench/moat/trench/etc areas. Although the width of the trench portion may vary depending on the lithography and etch conditions, the pitch remains constant. It will be apparent to those of ordinary skill in the art that the number of moat/trench areas may vary.

Figure 1B:
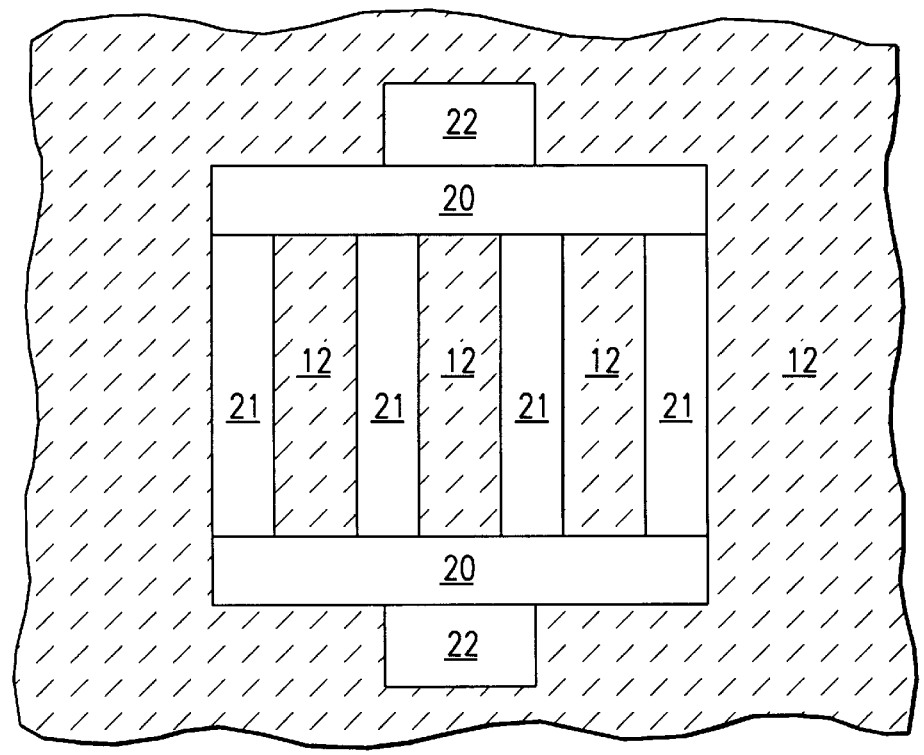

Although FIG. 1A shows the preferred series layout, FIG. 1B shows an alternative parallel layout according to a second embodiment of the invention. In FIG. 1B, strips 21 of a section of hard mask 20 extend across a section of semiconductor 10 and are connected in parallel. The cross-section shown in FIG. 2 is applicable to both the embodiment of FIG. 1A and the embodiment of FIG. 1B.

The hard mask 20 comprises a dielectric layer 16 over the semiconductor 10 and a conductive layer 18. Probe pads 22 comprise the same stack. Dielectric layer 16 may have an underlying pad oxide layer 14. In the preferred embodiment dielectric layer 16 comprises nitride. However, other dielectric layers that may serve as a CMP (chemical-mechanical-polish) stop layer may alternatively be used.

In the preferred embodiment, conductive layer 18 comprises doped polysilicon. The polysilicon may be doped either N+ or P+. However, other conductive materials, such as N+ or P+ doped SiC, metals, or combinations thereof may alternatively be used. The thickness of conductive layer 18 may be in the range of 2000–6000 Å. Typically, the thickness is less than the trench width if it is desired to remove conductive layer 18 during the trench etch.

In operation, the electrical resistance of conductive layer 18 is measured using probe pads 22. Probe pads 22 are placed on opposite ends of a predefined length of conductive layer 18. Since the length and thickness of conductive layer 18 are known, the average width can be determined from the electrical resistance measured. Because the pitch of the moat 11/trench 12 is known and unvarying, the trench 12 width can be determined by subtracting the width of the conductive layer 18 from the pitch.

An advantage of the invention is that the width of the trench can be determined in-line. In addition, the trench width can be measured at various points across a wafer to determine how the trench width varies across the wafer. The trench width can also easily be measured one multiple wafers to determine trench width variation from wafer to wafer.

Figure 3A:
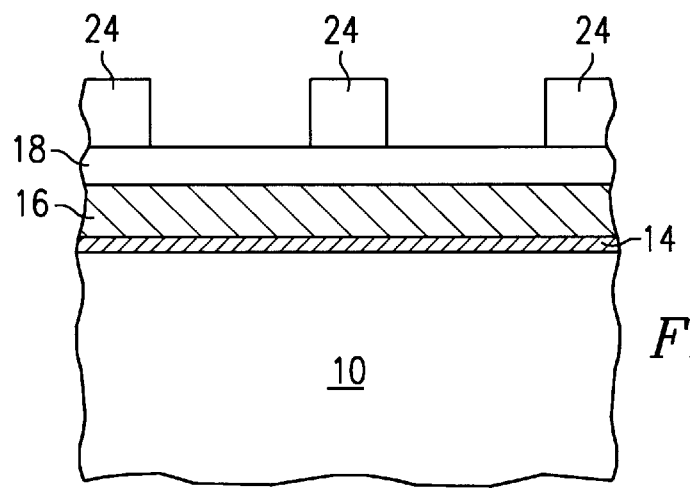
FIGS. 3A–3F are cross-sectional views of the test structure of FIG. 1A or 1B at various stages of fabrication.

A method for fabricating and using the test structure according to the first or second embodiments of the invention will now be discussed with reference to FIGS. 3A–3F. Referring to FIG. 3A, an optional pad oxide layer 14 is deposited over the semi conductor 10. A dielectric layer 16 is then deposited over pad oxide layer 14 (if present). The thickness of pad oxide layer 14 is on the order of 100–200 Å. The thickness of dielectric layer 16 is on the order of 100–300 Å. Dielectric layer 16 may comprise, for example, silicon-nitride. A conductive layer 18 is then deposited over dielectric layer 16. Conductive layer 18 comprises a conductive material such as doped (N+ or P+) polysilicon, doped SiC, or a metal. For doped polysilicon, conductive layer 18 has a thickness on the order of 1500–3500 Å.

After deposition, a moat/trench pattern 24 is formed over conductive layer 18. Moat/trench pattern 24 covers the areas of semiconductor 10 that are to be active or moat regions and exposes areas over semiconductor 10 where trench isolation is desired. Moat/trench pattern 24 would typically comprise a photoresist material.

Figure 3B:
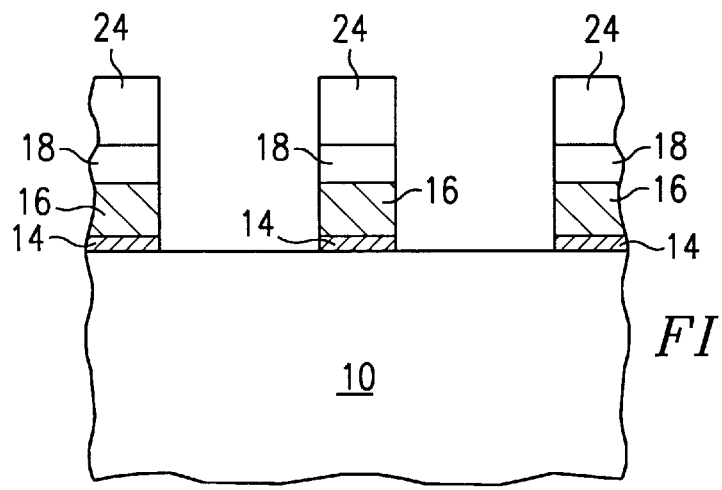

Referring to FIG. 3B, conductive layer 18, dielectric layer 16, and pad oxide 14 (if present) are etched using moat/trench pattern 24 to form a hard mask 20. At this point the pattern 24 may be removed and contact can be made to probe pads 22 to measure the electrical resistance of conductive layer 18. Given the electrical resistance, the length and thickness of conductive layer 18, the average width of conductive layer 18 is determined. The width of the trench 12 can then be determined by subtracting the width of conductive layer 18 from the known pitch. Adjustments to the hard mask 20 or even removal and re-formation of hard mask 20 can be performed prior to etching the trench 12 (and possible scrapping the wafer due, for example, to inadequate isolation).

Figure 3C:
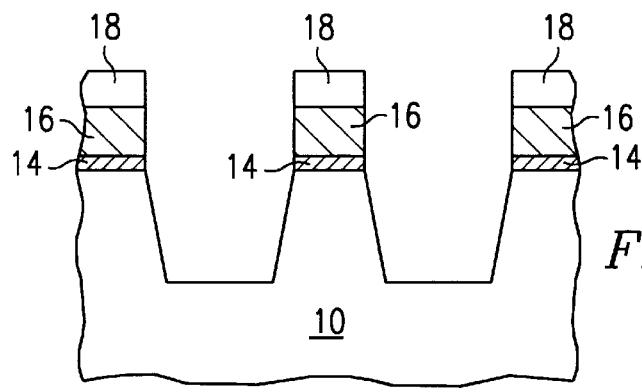

If the hard mask is within specs, semiconductor 10 is etched to form the shallow trench 12, as shown in FIG. 3C. If the pattern 24 has been removed, the trench etch will also remove conductive layer 18 if it comprises doped polysilicon. If pattern 24 has not been removed, the moat/trench pattern 24 is removed at this point and the electrical resistance/width determinations are alternatively performed at this point.

Figure 3D:
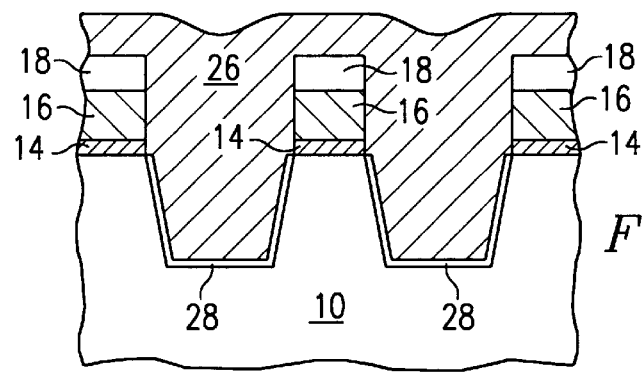
Figure 3E:
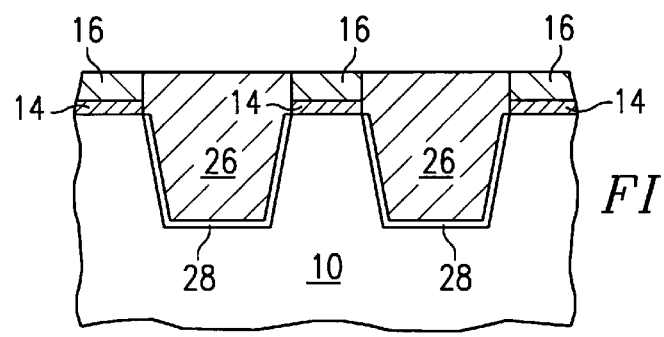

Next, the trench 12 is filled with a dielectric material 26 as is known in the art, as shown in FIG. 3D. Typically, a trench liner 28 is formed prior to filling the trench to remove etch damage. Then, the dielectric filler material 26 is deposited. Excess filler material 26 is then typically CMP'd back to planar with dielectric layer 16, as shown in FIG. 3E. During the CMP, conductive layer 18 is also removed if it has not been removed previously. Dielectric layer 16 is used as the CMP stopping layer. Accordingly, the material of dielectric layer 16 must be chosen such that the CMP process can distinguish between the dielectric layer 16 and dielectric filler material 26 (and the conductive layer 18 if still present) sufficiently to stop on dielectric layer 16.

Figure 3F:
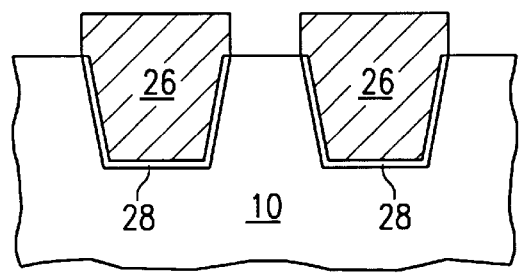

Finally, dielectric layer 16 and pad oxide layer 14 (if present) are removed, as shown in FIG. 3F. Processing then continues with the formation of transistors and other devices (not shown), interconnect, and packaging.

Figure 4:
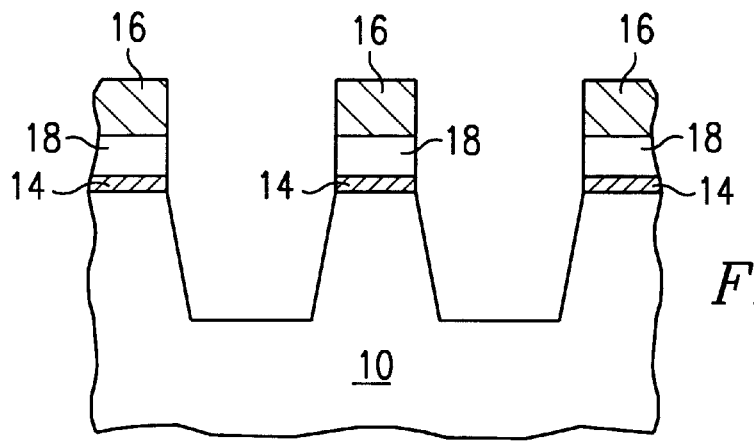
FIG. 4 is a cross-sectional view of test structure according to a third embodiment of the invention.

In another embodiment of the invention, the order of the conductive layer 18 and dielectric layer 16 is switched as shown in FIG. 4. This allows for a post-etch electrical resistance measurement. In this case, both the conductive layer 18 and dielectric layer 16 are removed after CMP of the dielectric filler material 26. Dielectric layer 16 is removed prior to the electrical resistance measurement, but after CMP. After the electrical resistance measurement, the conductive layer 18 is removed.

Figure 5:
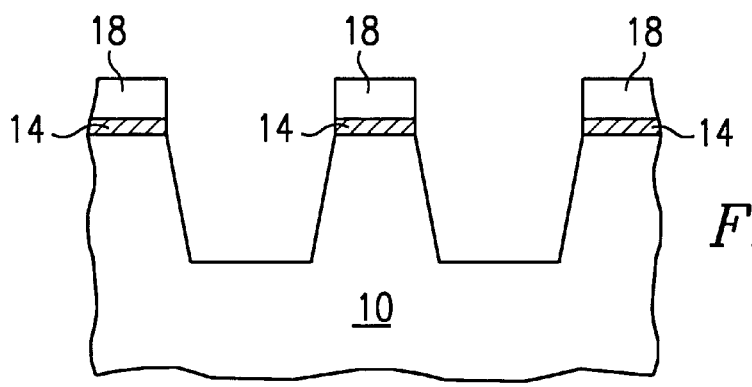
FIG. 5 is a cross-sectional view of test structure according to a fourth embodiment of the invention.

In another embodiment, dielectric layer 16 is omitted, as shown in FIG. 5. In this case, the conductive layer 18 is used as the CMP stop for the trench dielectric filler material 26. The resist is left in place during the trench etch and then removed prior to the electrical resistance measurement. The electrical resistance measurement is preferably done prior to CMP. Because the conductive layer is the CMP stop layer, CMP can cause variations in the conductive layer 18 that may make the measurements unreliable thereafter.

Figure 6:
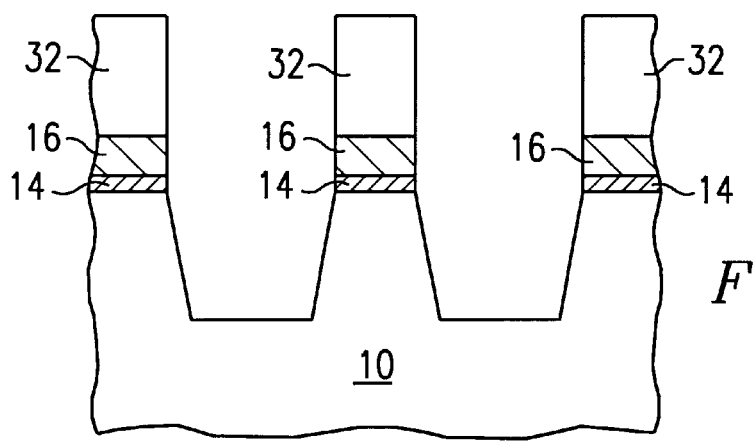
FIG. 6 is a cross-sectional view of test structure according to a fifth embodiment of the invention.

In yet another embodiment, a conductive photoresist 32 is used, as shown in FIG. 6. The conductive photoresist 32 is used in place of both the pattern 24 and conductive layer 18. Electrical resistance measurement is then made before trench etch and/or after the trench etch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming shallow trench isolation comprising:

forming a conductive layer over a semiconductor;

forming a trench mask using said conductive layer, said trench mask having trench openings;

connecting probe pads to two ends of a portion of said conductive layer after said step of forming said trench mask;

measuring the electrical resistance of said portion of said conductive layer;

determining a width of said trench openings using the measured electrical resistance;

etching a trench using said trench mask; and filling said trench.

2. The method of claim 1, wherein said conductive layer comprises a conductive photoresist.

3. The method of claim 1, wherein said conductive layer comprises doped polysilicon.

4. The method of claim 1, wherein said conductive layer comprises silicon-carbide.

5. The method of claim 1, wherein said conductive layer comprises a metal.

6. The method of claim 1, further comprising the step of forming a dielectric layer over said semiconductor prior to said step of forming said trench mask.

7. The method of claim 6, wherein the step of forming a trench mask comprises the steps of:

forming a pattern layer over said conductive layer; and etching said conductive layer and said dielectric layer to form said trench mask.

8. The method of claim 6, wherein said dielectric layer is formed prior to said conductive layer.

9. The method of claim 6, wherein said dielectric layer is formed after said conductive layer.

10. The method of claim 1, further comprising the step of forming a pad oxide layer on said semiconductor prior to forming said conductive layer.

11. A method of forming a test structure for determining trench width, comprising the steps of:

forming a conductive layer over a semiconductor, said conductive layer having a plurality of parallel strips connected to each other;

forming a trench mask using said conductive layer, said trench mask having trench openings;

forming probe pads at two ends of said conductive layer after said step of forming said trench mask;

measuring the electrical resistance of said conductive layer after said step of forming said trench mask;

determining an average width of said plurality of parallel strips from said electrical resistance;

determining a width of said trench openings using said average width;

etching a trench using said trench mask; and filling said trench.

12. The method of claim 11, wherein said conductive layer comprises a conductive photoresist.

13. The method of claim 11, wherein said conductive layer comprises doped polysilicon.

14. The method of claim 11, further comprising the step of forming a dielectric layer over said semiconductor prior to said step of forming said trench mask.

15. The method of claim 14, wherein the step of forming a trench mask comprises the steps of:

forming a pattern layer over said conductive layer; and etching said conductive layer and said dielectric layer to form said trench mask.

16. The method of claim 14, wherein said dielectric layer is formed prior to said conductive layer.

17. The method of claim 14, wherein said dielectric layer is formed after said conductive layer.

18. The method of claim 14, further comprising the step of forming a pad oxide layer on said semiconductor prior to forming said conductive layer.

* * * * *